United States Patent
Hamada

(10) Patent No.: US 7,679,106 B2
(45) Date of Patent: Mar. 16, 2010

(54) SEMICONDUCTOR INTEGRATED CIRCUIT

(75) Inventor: Mototsugu Hamada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 121 days.

(21) Appl. No.: 12/115,103

(22) Filed: May 5, 2008

(65) Prior Publication Data
US 2008/0283871 A1    Nov. 20, 2008

(30) Foreign Application Priority Data
May 15, 2007    (JP) .............................. 2007-129537

(51) Int. Cl.
*H01L 27/118*    (2006.01)
(52) U.S. Cl. ...................... 257/204; 257/202; 257/206; 257/210; 257/369; 257/E27.108
(58) Field of Classification Search ................ 257/202, 257/204, 206, 210, 369, E27.108
See application file for complete search history.

(56) References Cited

U.S. PATENT DOCUMENTS

| 4,570,176 A | 2/1986 | Kolwicz | |
| 6,872,990 B1* | 3/2005 | Kang | 257/206 |
| 2005/0280031 A1* | 12/2005 | Yano | 257/202 |
| 2006/0271902 A1* | 11/2006 | Yamashita et al. | 716/17 |
| 2007/0111405 A1* | 5/2007 | Watanabe et al. | 438/142 |
| 2008/0105904 A1* | 5/2008 | Sumikawa et al. | 257/202 |

FOREIGN PATENT DOCUMENTS

| JP | 58-127348 | 7/1983 |
| JP | 2-54576 | 2/1990 |
| JP | 2003-188361 | 7/2003 |
| JP | 2006-245390 | 9/2006 |

* cited by examiner

*Primary Examiner*—Victor A Mandala
(74) *Attorney, Agent, or Firm*—Oblon, Spivak, McClelland, Maier & Neustadt, L.L.P.

(57) ABSTRACT

A semiconductor integrated circuit having a substantially rectangular standard cell divided by first borderlines opposed to other standard cells longitudinally adjacent to the standard cell and second borderlines opposed to other standard cells laterally adjacent to the standard cell, the standard cell has: a p-type MOS transistor having first diffused regions and a first gate electrode; an n-type MOS transistor having second diffused regions and a second gate electrode with STI disposed for device isolation between the n-type MOS transistor and the p-type MOS transistor substantially in parallel with the first borderlines; dummy p-type MOS transistors having third gate electrodes disposed on the second borderlines so as to be adjacent to the first diffused regions of the p-type MOS transistor, the third gate electrodes being connected to power supply wiring so as to turn off the dummy p-type MOS transistors; and dummy n-type MOS transistors having fourth gate electrodes disposed on the second borderlines so as to be adjacent to the second diffused regions of the n-type MOS transistor, the fourth gate electrodes being connected to ground wiring so as to turn off the dummy n-type MOS transistors.

14 Claims, 12 Drawing Sheets

SEMICONDUCTOR INTEGRATED CIRCUIT

CROSS-REFERENCE TO RELATED APPLICATION

This application is based upon and claims the benefit of priority from the prior Japanese Patent Application No. 2007-129537, filed on May 15, 2007, the entire contents of which are incorporated herein by reference.

BACKGROUND OF THE INVENTION

1. Field of the Invention

The present invention relates to a semiconductor integrated circuit having a standard cell used for a cell-base design.

2. Background Art

In recent years, Shallow Trench Isolation (STI) for device isolation has been used in CMOS processes. It is known that because of finer design rules in the CMOS processes, the threshold values of CMOS transistors are affected by stresses caused by STI.

For example, the shorter the distance from STI to the channel of a MOS transistor, the greater the stress of STI on the channel. Thus the current driving capability of an n-type MOS transistor decreases and the current driving capability of a p-type MOS transistor increases. In other words, it is difficult to predict the performance of a formed MOS transistor.

In order to avoid the influence of a stress caused by STI, it is necessary to increase a distance from STI to the channel of the MOS transistor.

However, a long distance from STI to the channel of the MOS transistor results in a large cell layout.

In the case where a semiconductor integrated circuit is designed by combining a plurality of function blocks called standard cells having uniform heights and power supply wiring configurations, it is difficult to increase the distance from STI to the channel to avoid the influence of a stress caused by STI.

In some conventional semiconductor integrated circuits, dummy MOS transistors are used for device isolation (for example, see U.S. Pat. No. 4,570,176).

However, the conventional art is not premised on standard cells or is not devised in consideration of the influence of a stress caused by STI or leak current of the dummy MOS transistors.

SUMMARY OF THE INVENTION

According to one aspect of the present invention, there is provided: a semiconductor integrated circuit having a substantially rectangular standard cell divided by first borderlines opposed to other standard cells longitudinally adjacent to the standard cell and second borderlines opposed to other standard cells laterally adjacent to the standard cell, the standard cell comprising:

a p-type MOS transistor having first diffused regions and a first gate electrode;

an n-type MOS transistor having second diffused regions and a second gate electrode with STI disposed for device isolation between the n-type MOS transistor and the p-type MOS transistor substantially in parallel with the first borderlines;

dummy p-type MOS transistors having third gate electrodes disposed on the second borderlines so as to be adjacent to the first diffused regions of the p-type MOS transistor, the third gate electrodes being connected to power supply wiring so as to turn off the dummy p-type MOS transistors; and dummy n-type MOS transistors having fourth gate electrodes disposed on the second borderlines so as to be adjacent to the second diffused regions of the n-type MOS transistor, the fourth gate electrodes being connected to ground wiring so as to turn off the dummy n-type MOS transistors, wherein an absolute value of threshold voltage of the dummy p-type MOS transistor is higher than an absolute value of threshold voltage of the p-type MOS transistor, and an absolute value of threshold voltage of the dummy n-type MOS transistor is higher than an absolute value of threshold voltage of the n-type MOS transistor.

According to the other aspect of the present invention, there is provided: a semiconductor integrated circuit having a substantially rectangular standard cell divided by first borderlines opposed to other standard cells longitudinally adjacent to the standard cell and second borderlines opposed to other standard cells laterally adjacent to the standard cell, the standard cell comprising:

a p-type MOS transistor having first diffused regions and a first gate electrode;

an n-type MOS transistor having second diffused regions and a second gate electrode with STI disposed for device isolation between the n-type MOS transistor and the p-type MOS transistor substantially in parallel with the first borderlines;

dummy p-type MOS transistors having third gate electrodes disposed on the second borderlines so as to be adjacent to the first diffused regions of the p-type MOS transistor, the third gate electrodes being connected to power supply wiring so as to turn off the dummy p-type MOS transistors; and dummy n-type MOS transistors having fourth gate electrodes disposed on the second borderlines so as to be adjacent to the second diffused regions of the n-type MOS transistor, the fourth gate electrodes being connected to ground wiring so as to turn off the dummy n-type MOS transistors, wherein the dummy p-type MOS transistor has a gate length greater than a gate length of the p-type MOS transistor, and the dummy n-type MOS transistor has a gate length greater than a gate length of the n-type MOS transistor.

According to further aspect of the present invention, there is provided: a semiconductor integrated circuit having a substantially rectangular standard cell divided by first borderlines opposed to other standard cells longitudinally adjacent to the standard cell and second borderlines opposed to other standard cells laterally adjacent to the standard cell, the standard cell comprising:

a p-type MOS transistor having first diffused regions and a first gate electrode;

an n-type MOS transistor having second diffused regions and a second gate electrode with STI disposed for device isolation between the n-type MOS transistor and the p-type MOS transistor substantially in parallel with the first borderlines;

dummy p-type MOS transistors having third gate electrodes disposed on the second borderlines so as to be adjacent to the first diffused regions of the p-type MOS transistor, the third gate electrodes being connected to power supply wiring so as to turn off the dummy p-type MOS transistors; and dummy n-type MOS transistors having fourth gate electrodes disposed on the second borderlines so as to be adjacent to the second diffused regions of the n-type MOS transistor, the fourth gate electrodes being connected to ground wiring so as to turn off the dummy n-type MOS transistors, wherein the third gate electrodes of the dummy p-type MOS transistors are connected to the power supply wiring formed on a wiring layer disposed above a layer in which the third gate electrodes are formed, and the fourth gate electrodes of the dummy n-type MOS transistors are connected to the ground wiring formed on a wiring layer disposed above a layer in which the fourth gate electrodes are formed.

DETAILED DESCRIPTION

Exemplary embodiments of the present invention will now be described in accordance with the accompanying drawings.

First Embodiment

Figure 1:
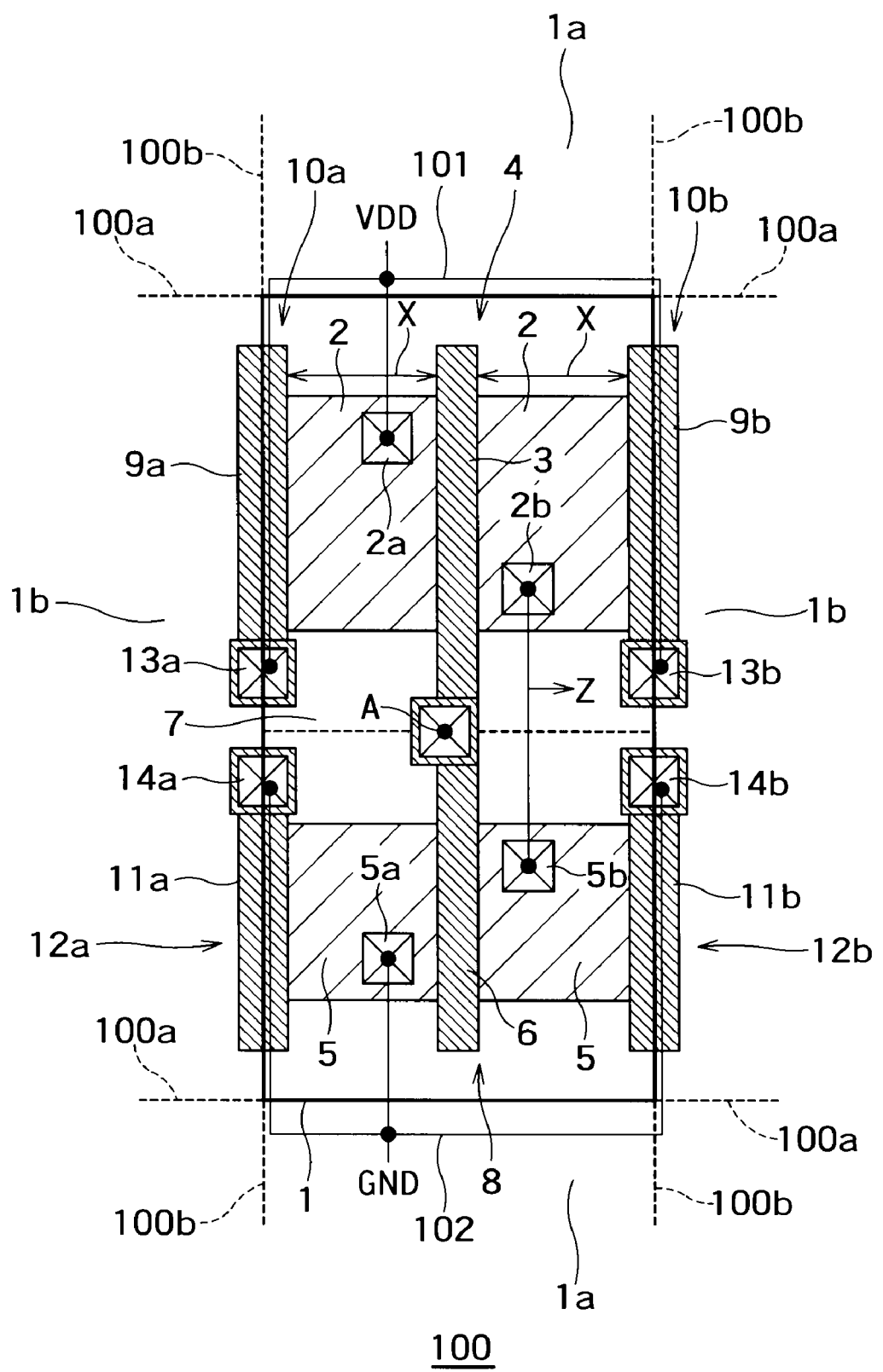
FIG. 1 shows the main configuration of a semiconductor integrated circuit 100 according to a first embodiment which is an aspect of the present invention.
Figure 2:
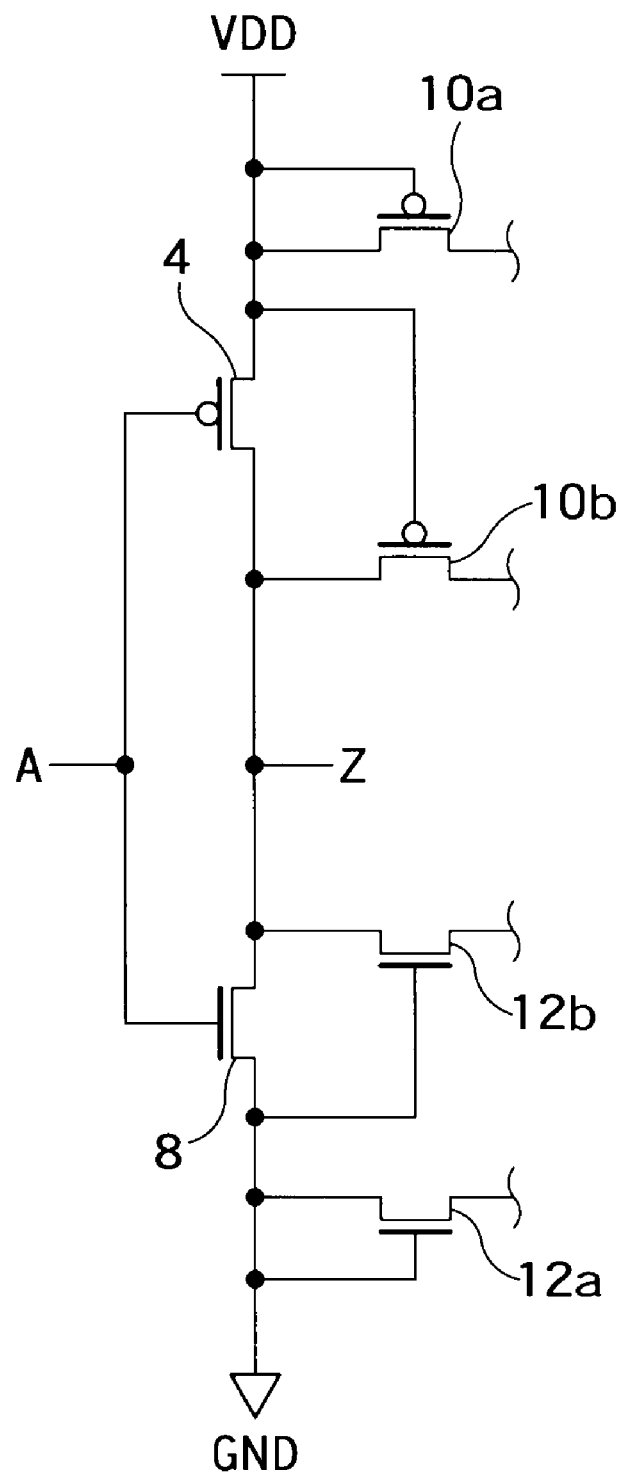
FIG. 2 is a circuit diagram showing the circuit configuration of a standard cell of the semiconductor integrated circuit 100 shown in FIG. 1.

FIG. 1 shows the main configuration of a semiconductor integrated circuit 100 according to a first embodiment which is an aspect of the present invention. FIG. 2 is a circuit diagram showing the circuit configuration of a standard cell of the semiconductor integrated circuit 100 shown in FIG. 1.

As shown in FIG. 1, the semiconductor integrated circuit 100 has a substantially rectangular standard cell 1 which is divided by first borderlines 100a opposed to other standard cells 1a longitudinally adjacent to the standard cell 1, and second borderlines 100b opposed to other standard cells 1b laterally adjacent to the standard cell 1. In other words, in FIG. 1, the first borderlines 100a laterally extend and the second borderlines 100b longitudinally extend.

In FIG. 1, the detailed configurations of the standard cells 1a and 1b are omitted for the sake of simplicity (the same hereinafter). For example, the standard cell 1a and the standard cell 1b are identical in configuration to the standard cell 1.

The standard cell 1 includes a p-type MOS transistor 4 which has first diffused regions 2 and a first gate electrode 3 and an n-type MOS transistor 8 which has second diffused regions 5 and a second gate electrode 6 with STI 7 disposed for device isolation between the p-type MOS transistor 4 and the n-type MOS transistor 8 substantially in parallel with the first borderlines 100a.

As shown in FIGS. 1 and 2, the p-type MOS transistor 4 has the source connected to power supply wiring 101 via a contact 2a, the drain connected to an output Z via a contact 2b, and the gate connected to an input A.

The n-type MOS transistor 8 has the source connected to ground wiring 102 via a contact 5a, the drain connected to the output Z and the drain of the p-type MOS transistor 4 via a contact 5b, and the gate connected to the input A and the gate of the p-type MOS transistor 4.

As described above, in FIGS. 1 and 2, the standard cell 1 includes the layout of an inverter made up of the p-type MOS transistor 4 and the n-type MOS transistor 8.

Further, the standard cell 1 includes dummy p-type MOS transistors 10a and 10b for device isolation between the standard cell 1 and the standard cells 1b that are adjacent to the standard cell 1 through the second borderlines 100b. The dummy p-type MOS transistors 10a and 10b include third gate electrodes 9a and 9b which are disposed on the second borderlines 100b so as to be adjacent to the first diffused regions 2 of the p-type MOS transistor 4.

In this configuration, the power supply wiring 101 is formed on, for example, a wiring layer disposed above a wiring layer in which the third gate electrodes 9a and 9b are formed.

The third gate electrodes 9a and 9b of the dummy p-type MOS transistors 10a and 10b are connected to the power supply wiring 101 via first contacts 13a and 13b that are connected to the ends of the third gate electrodes 9a and 9b at the center of the standard cell 1. Therefore, a power supply potential VDD is applied to the third gate electrodes 9a and 9b so as to turn off the dummy p-type MOS transistors 10a and 10b.

The absolute values of threshold voltages of the dummy p-type MOS transistors 10a and 10b are set higher than the absolute value of threshold voltage of the p-type MOS transistor 4. Thus the dummy p-type MOS transistors 10a and 10b are turned off with higher reliability than the p-type MOS transistor 4. In other words, it is possible to suppress leakage current between the standard cell 1 and the standard cells 1b that are adjacent to the standard cell 1 through the second borderlines 100b.

In order to suppress the leakage current, the gate lengths of the dummy p-type MOS transistors 10a and 10b may be set longer than the gate length of the p-type MOS transistor 4.

The standard cell 1 further includes dummy n-type MOS transistors 12a and 12b for device isolation between the standard cell 1 and the standard cells 1b that are adjacent to the standard cell 1 through the second borderlines 100b. The dummy n-type MOS transistors 12a and 12b have fourth gate electrodes 11a and 11b disposed on the second borderlines 100b so as to be adjacent to the second diffused regions 5 of the n-type MOS transistor 8.

In this configuration, the ground wiring 102 is formed on, for example, a wiring layer disposed above a wiring layer in which the fourth gate electrodes 11a and 11b are formed.

The fourth gate electrodes 11a and 11b of the dummy n-type MOS transistors 12a and 12b are connected to the ground wiring 102 via second contacts 14a and 14b that are connected to the ends of the fourth gate electrodes 11a and 11b at the center of the standard cell 1. Therefore, a ground potential GND is applied to the fourth gate electrodes 11a and 11b so as to turn off the dummy n-type MOS transistors 12a and 12b.

The absolute values of threshold voltages of the dummy n-type MOS transistors 12a and 12b are set higher than the absolute value of threshold voltage of the n-type MOS transistor 8. Thus the dummy n-type MOS transistors 12a and 12b are turned off with higher reliability than the n-type MOS transistor 8. In other words, it is possible to suppress leakage current between the standard cell 1 and the standard cells 1b that are adjacent to the standard cell 1 through the second borderlines 100b.

In order to suppress the leakage current, the gate lengths of the dummy n-type MOS transistors 12a and 12b may be set longer than the gate length of the n-type MOS transistor 8.

As described above, the gates of the dummy p-type MOS transistors 10a and 10b are connected to the power supply potential VDD and the gates of the dummy n-type MOS transistors 12a and 12b are connected to the ground potential GND. Thus the transistors are turned off and insulation is provided between the standard cells that are adjacent to each other through the second borderlines 100b.

As described above, in the semiconductor integrated circuit 100 configured thus, the standard cell 1 and the standard cells 1b are isolated from each other by the dummy p-type MOS transistors 10a and 10b and the dummy n-type MOS transistors 12a and 12b which are provided on the second borderlines 100b. Thus it is possible to reduce the influence of a stress on the MOS transistors at least in the directions of the first borderlines 100a (in the channel directions of the MOS transistors).

Therefore, it is possible to avoid STI stress and increase the predictability of the on currents of the MOS transistors composing the standard cell.

Further, since the dummy MOS transistors are provided on the borderlines of the standard cell, the diffused regions can be formed continuously from the other standard cells adjacent to the diffused regions.

As described above, the standard cell 1 and the standard cells 1a are isolated from each other by STI provided along the first borderlines 100a.

As described above, for example, when a distance from STI to the channel of the MOS transistor (the width of the diffused region) is 2 μm or less, a large stress is caused by STI on the channel.

Therefore, for example, distances "X" (the widths of the diffused regions) are set at 2 μm or less between the first gate electrode 3 of the p-type MOS transistor 4 and the third gate electrodes 9a and 9b of the dummy p-type MOS transistors 10a and 10b. Similarly, for example, distances "X" are set at 2 μm or less between the second gate electrode 6 of the n-type MOS transistor 8 and the fourth gate electrodes 11a and 11b of the dummy n-type MOS transistors 12a and 12b.

Thus device isolation can be achieved by the dummy MOS transistors particularly in a range where device isolation by STI may cause a stress affecting the channel (the diffused region has a width of 2 μm or less), so that the stress can be avoided.

When the dummy MOS transistors have disadvantageous gate leakage current, the gate leakage can be avoided at least by forming the gates using a high dielectric material.

As described above, according to the semiconductor integrated circuit of the present embodiment, it is possible to achieve device isolation between the adjacent standard cells while avoiding the influence of the device isolation on the MOS transistors.

Second Embodiment

The first embodiment described an example of a standard cell including an inverter made up of MOS transistors.

The present embodiment will describe another example of a standard cell including an inverter made up of MOS transistors.

Figure 3:
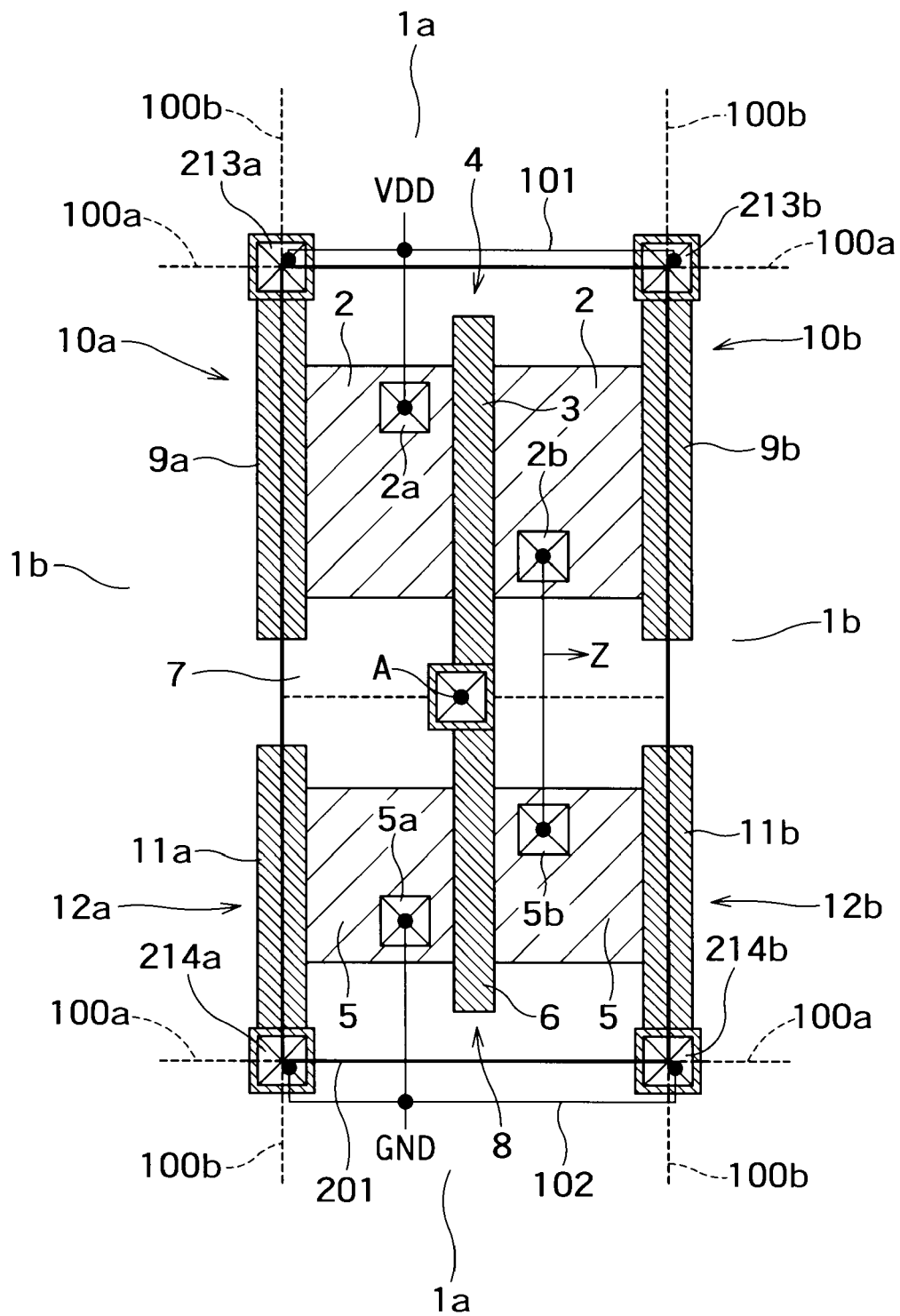
FIG. 3 shows the main configuration of a semiconductor integrated circuit 200 according to a second embodiment of the present invention.

FIG. 3 shows the main configuration of a semiconductor integrated circuit 200 according to a second embodiment of the present invention.

In FIG. 3, the same reference numerals as those of FIG. 1 indicate the same configurations as those of the first embodiment. Further, in FIG. 3, the circuit configuration of the standard cell of the semiconductor integrated circuit 200 is identical to the circuit configuration of the circuit diagram shown in FIG. 2.

As shown in FIG. 3, the semiconductor integrated circuit 200 has a substantially rectangular standard cell 201 which is divided by first borderlines 100a opposed to other standard cells 1a longitudinally adjacent to the standard cell 201, and second borderlines 100b opposed to other standard cells 1b laterally adjacent to the standard cell 201. For example, the other standard cells 1a longitudinally adjacent to the standard cell 201 and the other standard cells 1b laterally adjacent to the standard cell 201 are identical in configuration to the standard cell 201.

The standard cell 201 is identical in configuration to the standard cell 1 of the first embodiment except for the layout of first and second contacts.

To be specific, first contacts 213a and 213b are formed on the intersection points of the second borderlines 100b and the first borderline 100a disposed close to a p-type MOS transistor 4. Similarly, second contacts 214a and 214b are formed on the intersection points of the second borderlines 100b and the first borderline 100a disposed close to an n-type MOS transistor 8.

Further, third gate electrodes 9a and 9b of dummy p-type MOS transistors 10a and 10b are connected to power supply wiring 101 via the first contacts 213a and 213b connected to the third gate electrodes 9a and 9b. Therefore, a power supply potential VDD is applied to the third gate electrodes 9a and 9b so as to turn off the dummy p-type MOS transistors 10a and 10b.

Similarly, fourth gate electrodes 11a and 11b of dummy n-type MOS transistors 12a and 12b are connected to ground wiring 102 via second contacts 214a and 214b connected to the fourth gate electrodes 11a and 11b. Therefore, a ground potential GND is applied to the fourth gate electrodes 11a and 11b so as to turn off the dummy n-type MOS transistors 12a and 12b.

Thus the gate voltages of the dummy MOS transistors can be directly supplied from, for example, the power supply wiring 101 and the ground wiring 102 which are provided near the first borderlines 100a.

As described above, as in the first embodiment, the gates of the dummy p-type MOS transistors 10a and 10b are connected to the power supply potential VDD and the gates of the dummy n-type MOS transistors 12a and 12b are connected to the ground potential GND, so that the transistors are turned off and insulation is provided between the standard cells that are adjacent to each other through the second borderlines 100b.

As described above, in the semiconductor integrated circuit 200 configured thus, the standard cell 201 and the standard cells 1b are isolated from each other by the dummy p-type MOS transistors 10a and 10b and the dummy n-type MOS transistors 12a and 12b which are provided on the second borderlines 100b. Thus it is possible to reduce the influence of a stress on the MOS transistors at least in the directions of the first borderlines 100a (in the channel directions of the MOS transistors).

Therefore, it is possible to avoid STI stress and increase the predictability of the on currents of the MOS transistors composing the standard cell.

Moreover, since the dummy MOS transistors are provided on the borderlines of the standard cells, diffused regions can be formed continuously from the other standard cells adjacent to the diffused regions.

The standard cell 201 and the standard cells 1a are isolated from each other by STI provided along the first borderlines 100a.

As described above, according to the semiconductor integrated circuit of the present embodiment, it is possible to achieve device isolation between the adjacent standard cells while avoiding the influence of the device isolation on the MOS transistors as in the first embodiment.

Third Embodiment

The first and second embodiments described examples of a standard cell including an inverter made up of MOS transistors.

The present embodiment will describe still another example of a standard cell including an inverter made up of MOS transistors.

Figure 4:
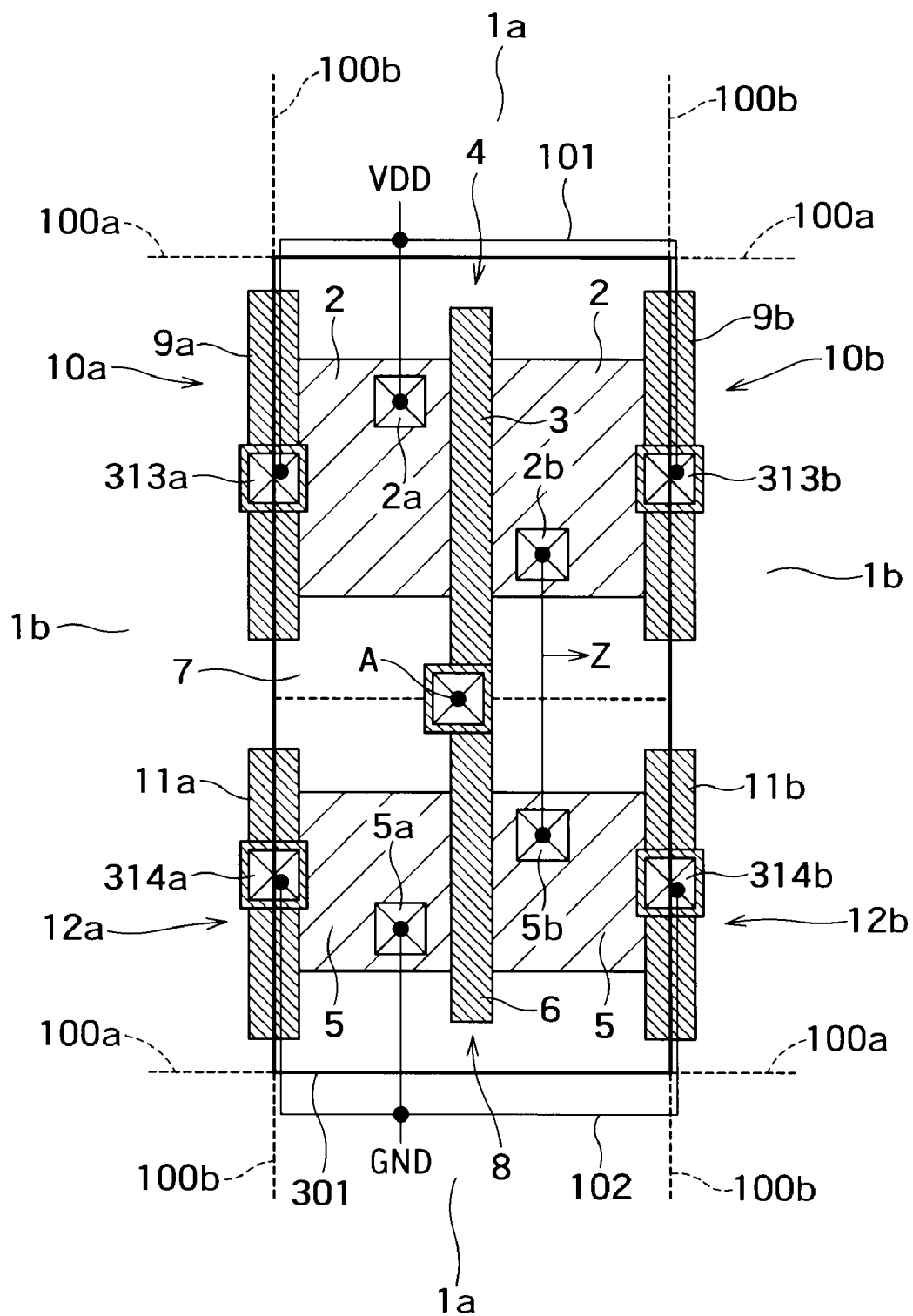
FIG. 4 shows the main configuration of a semiconductor integrated circuit 300 according to a third embodiment of the present invention.

FIG. 4 shows the main configuration of a semiconductor integrated circuit 300 according to a third embodiment of the present invention.

In FIG. 4, the same reference numerals as those of FIG. 1 indicate the same configurations as those of the first embodiment. Further, in FIG. 4, the circuit configuration of the standard cell of the semiconductor integrated circuit 300 is identical to the circuit configuration of the circuit diagram shown in FIG. 2.

As shown in FIG. 4, the semiconductor integrated circuit 300 has a substantially rectangular standard cell 301 which is divided by first borderlines 100a opposed to other standard cells 1a longitudinally adjacent to the standard cell 301, and second borderlines 100b opposed to other standard cells 1b laterally adjacent to the standard cell 301. For example, the other standard cells 1a longitudinally adjacent to the standard cell 301 and the other standard cells 1b laterally adjacent to the standard cell 301 are identical in configuration to the standard cell 301.

The standard cell 301 is identical in configuration to the standard cell 1 of the first embodiment except for the layout of first and second contacts.

To be specific, first contacts 313a and 313b are connected to the central portions of third gate electrodes 9a and 9b. Similarly, second contacts 314a and 314b are connected to the central portions of fourth gate electrodes 11a and 11b.

Further, the third gate electrodes 9a and 9b of dummy p-type MOS transistors 10a and 10b are connected to power supply wiring 101 via the first contacts 313a and 313b connected to the third gate electrodes 9a and 9b. Therefore, a power supply potential VDD is applied to the third gate electrodes 9a and 9b so as to turn off the dummy p-type MOS transistors 10a and 10b.

Similarly, the fourth gate electrodes 11a and 11b of dummy n-type MOS transistors 12a and 12b are connected to ground wiring 102 via the second contacts 314a and 314b connected to the fourth gate electrodes 11a and 11b. Therefore, a ground potential GND is applied to the fourth gate electrodes 11a and 11b so as to turn off the dummy n-type MOS transistors 12a and 12b.

As described above, as in the first embodiment, the gates of the dummy p-type MOS transistors 10a and 10b are connected to the power supply potential VDD and the gates of the dummy n-type MOS transistors 12a and 12b are connected to the ground potential GND, so that the transistors are turned off and insulation is provided between the standard cells that are adjacent to each other through the second borderlines 100b.

As described above, in the semiconductor integrated circuit 300 configured thus, the standard cell 301 and the standard cells 1b are isolated from each other by the dummy p-type MOS transistors 10a and 10b and the dummy n-type MOS transistors 12a and 12b which are provided on the second borderlines 100b. Thus it is possible to reduce the influence of a stress on the MOS transistors at least in the directions of the first borderlines 100a (in the channel directions of the MOS transistors).

Therefore, it is possible to avoid STI stress and increase the predictability of the on currents of the MOS transistors composing the standard cell.

Moreover, since the dummy MOS transistors are provided on the borderlines of the standard cell, diffused regions can be formed continuously from the other standard cells adjacent to the diffused regions.

The standard cell 301 and the standard cells 1a are isolated from each other by STI provided along the first borderlines 100a.

As described above, according to the semiconductor integrated circuit of the present embodiment, it is possible to achieve device isolation between the adjacent standard cells while avoiding the influence of the device isolation on the MOS transistors as in the first embodiment.

Fourth Embodiment

The first to third embodiments described examples of a standard cell including an inverter made up of MOS transistors.

The present embodiment will describe still another example of a standard cell including an inverter made up of MOS transistors.

Figure 5:
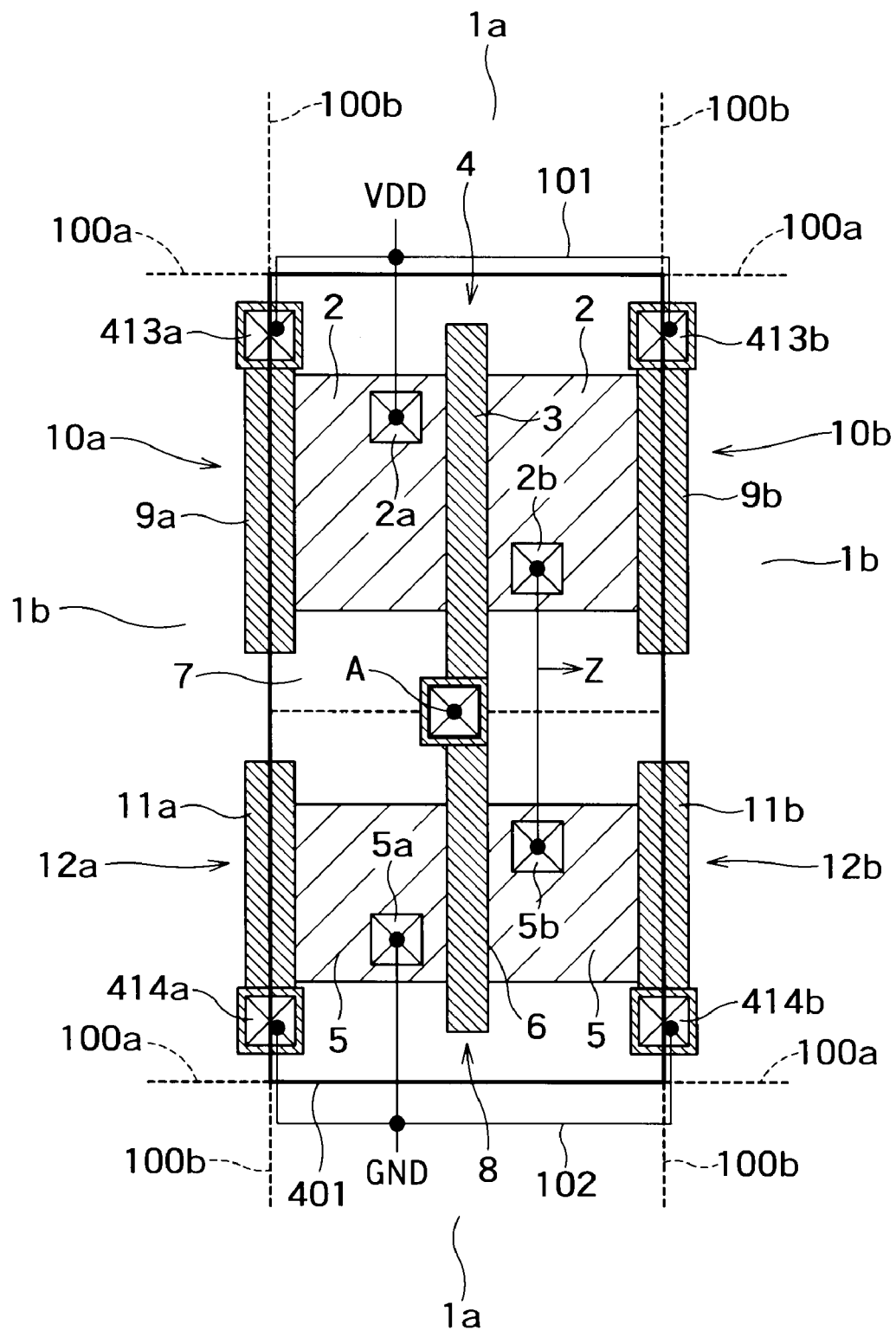
FIG. 5 shows the main configuration of a semiconductor integrated circuit 400 according to a fourth embodiment of the present invention.

FIG. 5 shows the main configuration of a semiconductor integrated circuit 400 according to a fourth embodiment of the present invention.

In FIG. 5, the same reference numerals as those of FIG. 1 indicate the same configurations as those of the first embodiment. Further, in FIG. 5, the circuit configuration of the standard cell of the semiconductor integrated circuit 400 is identical to the circuit configuration of the circuit diagram shown in FIG. 2.

As shown in FIG. 5, the semiconductor integrated circuit 400 has a substantially rectangular standard cell 401 which is divided by first borderlines 100a opposed to other standard cells 1a longitudinally adjacent to the standard cell 401, and second borderlines 100b opposed to other standard cells 1b laterally adjacent to the standard cell 401. For example, the other standard cells 1a longitudinally adjacent to the standard cell 401 and the other standard cells 1b laterally adjacent to the standard cell 401 are identical in configuration to the standard cell 401.

The standard cell 401 is identical in configuration to the standard cell 1 of the first embodiment except for the layout of first and second contacts.

To be specific, first contacts 413a and 413b are connected to the ends of third gate electrodes 9a and 9b on the side of the first borderline 100a. Similarly, second contacts 414a and 414b are connected to the ends of fourth gate electrodes 11a and 11b on the side of the first borderline 100a.

Further, the third gate electrodes 9a and 9b of dummy p-type MOS transistors 10a and 10b are connected to power supply wiring 101 via the first contacts 413a and 413b connected to the third gate electrodes 9a and 9b. Therefore, a power supply potential VDD is applied to the third gate electrodes 9a and 9b so as to turn off the dummy p-type MOS transistors 10a and 10b.

Similarly, the fourth gate electrodes 11a and 11b of dummy n-type MOS transistors 12a and 12b are connected to ground wiring 102 via the second contacts 414a and 414b connected to the fourth gate electrodes 11a and 11b. Therefore, a ground potential GND is applied to the fourth gate electrodes 11a and 11b so as to turn off the dummy n-type MOS transistors 12a and 12b.

As described above, as in the first embodiment, the gates of dummy p-type MOS transistors 10a and 10b are connected to the power supply potential VDD and the gates of the dummy n-type MOS transistors 12a and 12b are connected to the ground potential GND, so that the transistors are turned off and insulation is provided between the standard cells that are adjacent to each other through the second borderlines 100b.

As described above, in the semiconductor integrated circuit 400 configured thus, the standard cell 401 and the standard cells 1b are isolated from each other by the dummy p-type MOS transistors 10a and 10b and the dummy n-type MOS transistors 12a and 12b which are provided on the second borderlines 100b. Thus it is possible to reduce the influence of a stress on the MOS transistors at least in the directions of the first borderlines 100a (in the channel directions of the MOS transistors).

Therefore, it is possible to avoid STI stress and increase the predictability of the on currents of the MOS transistors composing the standard cell.

Moreover, since the dummy MOS transistors are provided on the borderlines of the standard cell, diffused regions can be formed continuously from the other standard cells adjacent to the diffused regions.

The standard cell 401 and the standard cells 1a are isolated from each other by STI provided along the first borderlines 100a.

As described above, according to the semiconductor integrated circuit of the present embodiment, it is possible to achieve device isolation between the adjacent standard cells while avoiding the influence of the device isolation on the MOS transistors as in the first embodiment.

Fifth Embodiment

The second embodiment described an example of a standard cell including an inverter made up of MOS transistors.

The present embodiment will describe an example of a configuration in which standard cells having the same configurations as the standard cell of the second embodiment are adjacent to each other through a first borderline.

Figure 6:
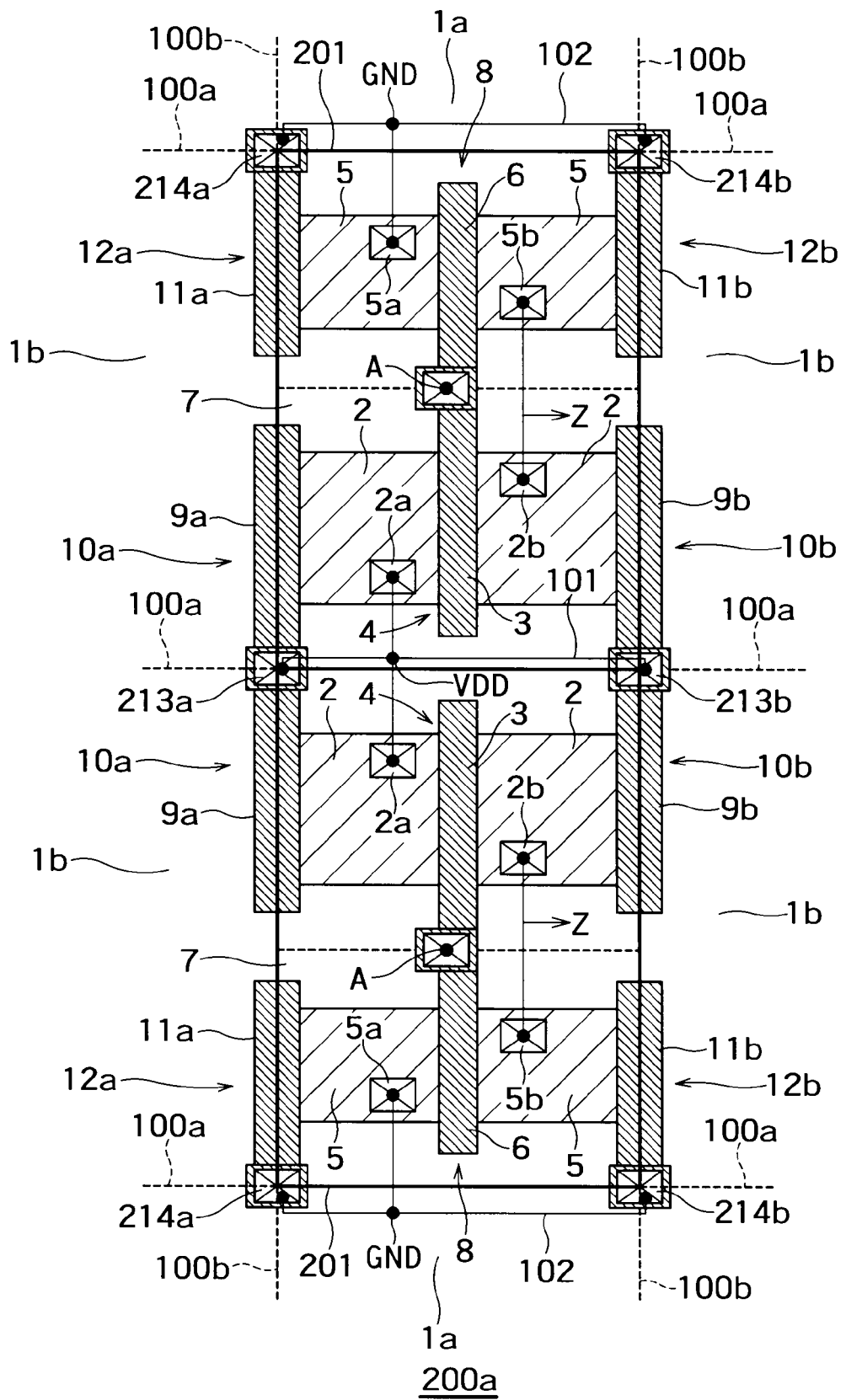
FIG. 6 shows the main configuration of a semiconductor integrated circuit 200a according to a fifth embodiment of the present invention.

FIG. 6 shows the main configuration of a semiconductor integrated circuit 200a according to a fifth embodiment of the present invention.

In FIG. 6, the same reference numerals as those of FIG. 2 indicate the same configurations as those of the second embodiment. Further, in FIG. 6, the circuit configuration of the standard cell of the semiconductor integrated circuit 200a is identical to the circuit configuration of the circuit diagram shown in FIG. 2.

As shown in FIG. 6, the semiconductor integrated circuit 200a has a substantially rectangular standard cell 201 which is divided by first borderlines 100a opposed to other standard cells 1a longitudinally adjacent to the standard cell 201, and second borderlines 100b opposed to other standard cells 1b laterally adjacent to the standard cell 201. In the present embodiment, at least the other standard cells 1a longitudinally adjacent to the standard cell 201 are identical in configuration to the standard cell 201 (represented as standard cells 201 in FIG. 6).

As in the second embodiment, first contacts 213a and 213b are formed on the intersection points of the second borderlines 100b and the first borderline 100a disposed close to p-type MOS transistors 4. Similarly, second contacts 214a and 214b are formed on the intersection points of the second borderlines 100b and the first borderline 100a disposed close to n-type MOS transistors 8.

Therefore, as shown in FIG. 6, the standard cells 201 adjacent to each other through the first borderline 100a share the first contacts 213a and 213b. Thus the layout area can be reduced.

The standard cells 201 adjacent to each other through the first borderline 100a may be disposed to share the second contacts 214a and 214b.

In the semiconductor integrated circuit 200a, as in the second embodiment, the gates of dummy p-type MOS transistors 10a and 10b are connected to a power supply potential VDD and the gates of dummy n-type MOS transistors 12a and 12b are connected to a ground potential GND, so that the transistors are turned off and insulation is provided between the standard cells that are adjacent to each other through the second borderlines 100b.

As described above, in the semiconductor integrated circuit 200a configured thus, the standard cell 201 and the standard cells 1b are isolated from each other by the dummy p-type MOS transistors 10a and 10b and the dummy n-type MOS transistors 12a and 12b which are provided on the second borderlines 100b. Thus it is possible to reduce the influence of a stress on the MOS transistors at least in the directions of the first borderlines 100a (in the channel directions of the MOS transistors).

Therefore, it is possible to avoid STI stress and increase the predictability of the on currents of the MOS transistors composing the standard cell.

Moreover, since the dummy MOS transistors are provided on the borderlines of the standard cell, diffused regions can be formed continuously from the other standard cells adjacent to the diffused regions.

The standard cells 201 longitudinally adjacent to each other are isolated from each other by STI provided along the first borderlines 100a.

As described above, according to the semiconductor integrated circuit of the present embodiment, it is possible to achieve device isolation between the adjacent standard cells while avoiding the influence of the device isolation on the MOS transistors as in the second embodiment.

Sixth Embodiment

The first to fifth embodiments described examples of a standard cell including an inverter made up of MOS transistors.

The present embodiment will describe an example of a standard cell including a two-input NAND circuit made up of MOS transistors.

Figure 7:
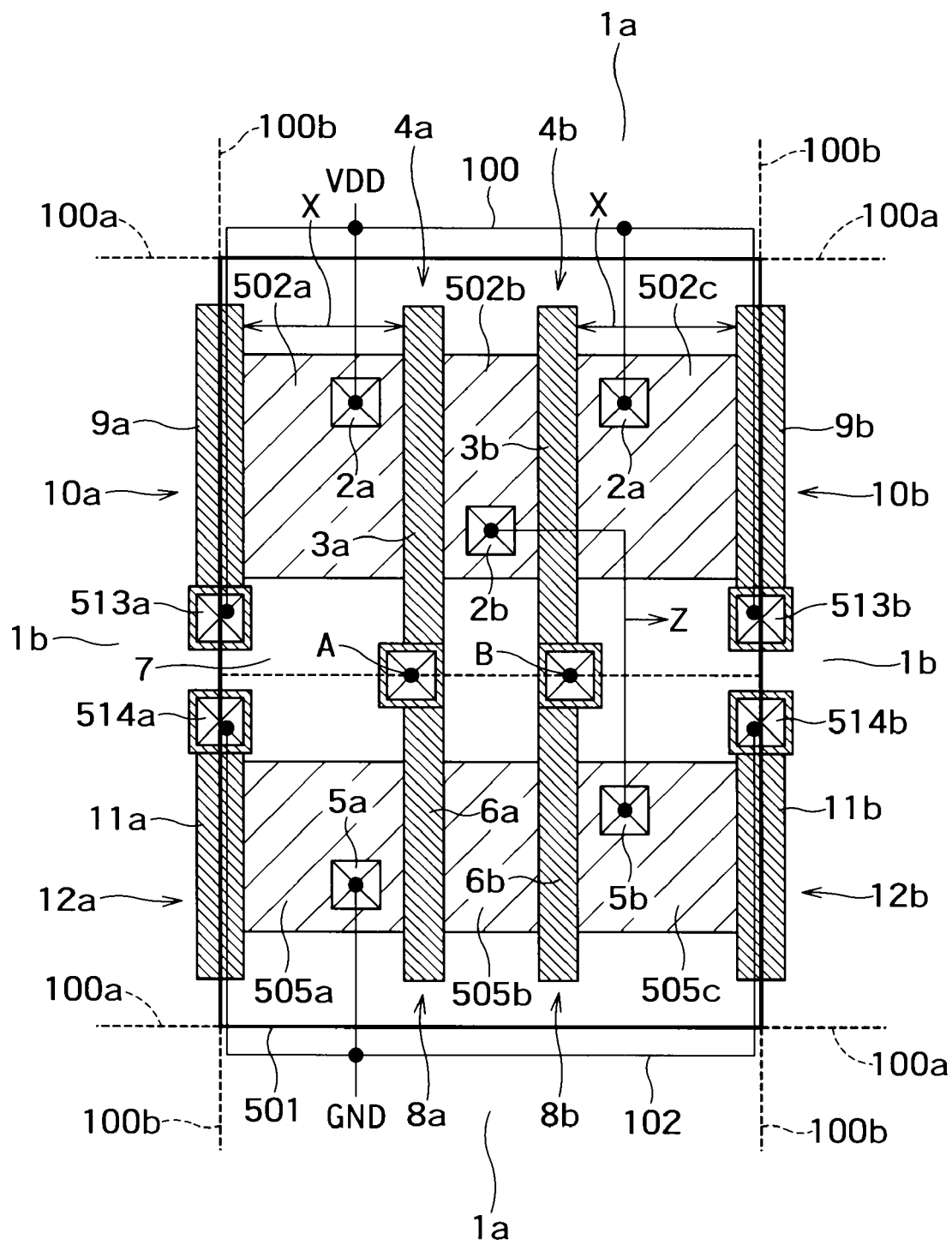
FIG. 7 shows the main configuration of a semiconductor integrated circuit 500 according to a sixth embodiment which is an aspect of the present invention.
Figure 8:
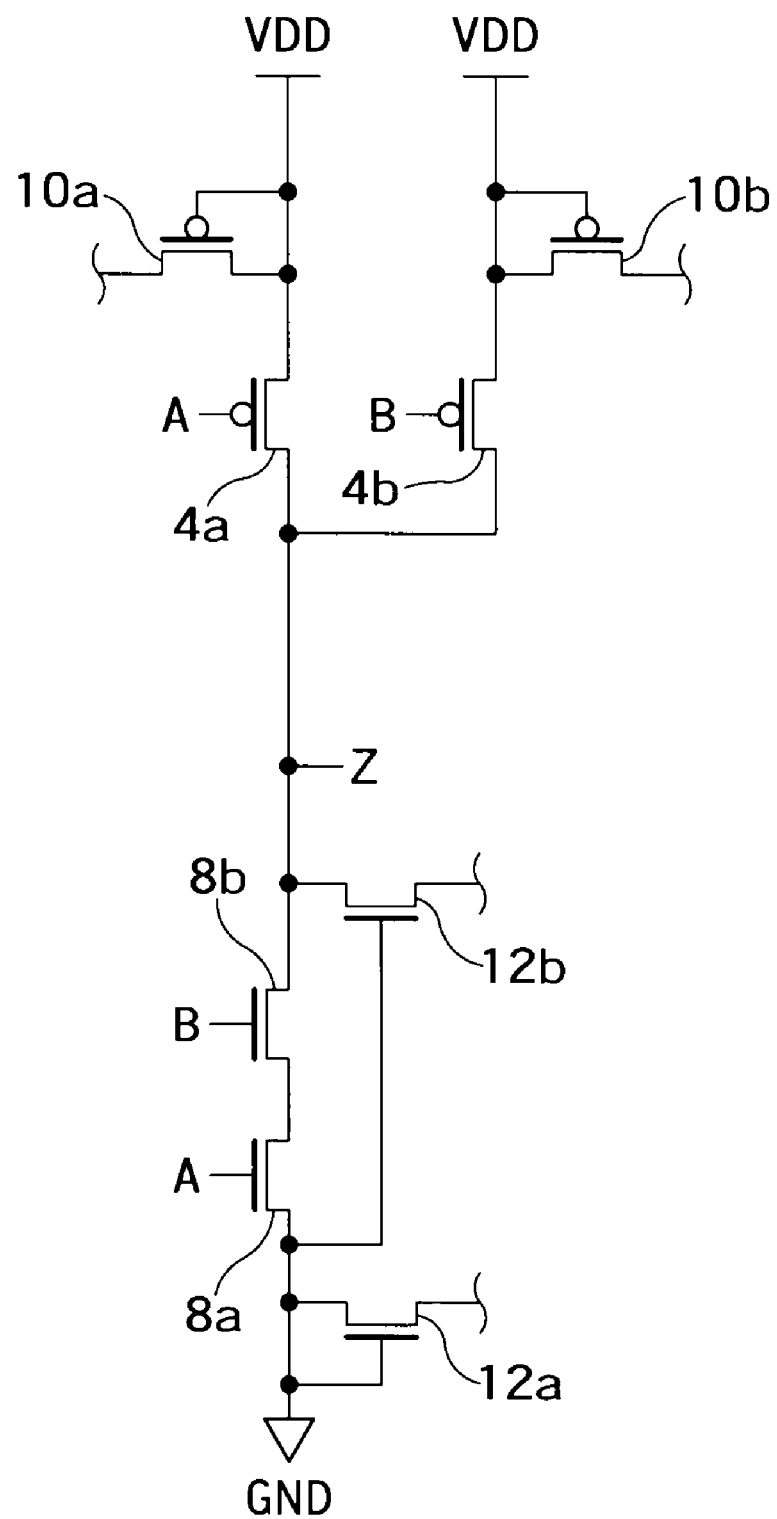
FIG. 8 is a circuit diagram showing the circuit configuration of the standard cell of the semiconductor integrated circuit 500 shown in FIG. 7.

FIG. 7 shows the main configuration of a semiconductor integrated circuit 500 according to a sixth embodiment which is an aspect of the present invention. FIG. 8 is a circuit diagram showing the circuit configuration of the standard cell of the semiconductor integrated circuit 500 shown in FIG. 7.

As shown in FIG. 7, the semiconductor integrated circuit 500 has a substantially rectangular standard cell 501 which is divided by first borderlines 100a opposed to other standard cells 1a longitudinally adjacent to the standard cell 501, and second borderlines 100b opposed to other standard cells 1b laterally adjacent to the standard cell 501. For example, the other standard cells 1a longitudinally adjacent to the standard cell 501 and the other standard cells 1b laterally adjacent to the standard cell 501 are identical in configuration to the standard cell 501.

The standard cell 501 includes a first p-type MOS transistor 4a which has first diffused regions 502a and 502b and a first gate electrode 3a and a second p-type MOS transistor 4b which has the first diffused region 502b, a first diffused region 502c, and a first gate electrode 3b.

Further, the standard cell 501 includes a first n-type MOS transistor 8a which has second diffused regions 505a and 505b and a second gate electrode 6a and a second n-type MOS transistor 8b which has the second diffused region 505b, a second diffused region 505c, and a second gate electrode 6b.

The first and second n-type MOS transistors 8a and 8b have STI 7 disposed for device isolation between the first and second n-type MOS transistors 8a and 8b and the first and second p-type MOS transistors 4a and 4b substantially in parallel with the first borderlines 100a.

As shown in FIGS. 7 and 8, the first and second p-type MOS transistors 4a and 4b have the sources connected to power supply wiring 101 via contacts 2a, the drains connected to an output Z via a contact 2b, and the gates connected to inputs A and B, respectively.

The first n-type MOS transistor 8a has the source connected to ground wiring 102 via a contact 5a, the drain connected to the source of the second n-type MOS transistor 8b, and the gate connected to the input A and the gate of the first p-type MOS transistor 4a.

The second n-type MOS transistor 8b has the drain connected to the output Z and the drains of the first and second p-type MOS transistors 4a and 4b via the contact 5b, and the gate connected to the input B and the gate of the second p-type MOS transistor 4b.

In this way, in FIGS. 7 and 8, the standard cell 501 includes an NAND layout of two inputs (A, B) made up of the first and second p-type MOS transistors 4a and 4b and the first and second n-type MOS transistors 8a and 8b.

Further, as in the first embodiment, the standard cell 501 includes dummy p-type MOS transistors 10a and 10b for device isolation between the standard cell 501 and the standard cells 1b that are adjacent to the standard cell 501 through the second borderlines 100b. The dummy p-type MOS transistors 10a and 10b include third gate electrodes 9a and 9b which are disposed on the second borderlines 100b so as to be adjacent to the first diffused regions 502a and 502c of the first and second p-type MOS transistors 4a and 4b.

In this configuration, the power supply wiring 101 is formed on, for example, a wiring layer disposed above a wiring layer in which the third gate electrodes 9a and 9b are formed.

As in the first embodiment, the third gate electrodes 9a and 9b of the dummy p-type MOS transistors 10a and 10b are connected to the power supply wiring 101 via the first contacts 513a and 513b that are connected to the ends of the third gate electrodes 9a and 9b at the center of the standard cell 501. Therefore, a power supply potential VDD is applied to the third gate electrodes 9a and 9b so as to turn off the dummy p-type MOS transistors 10a and 10b.

As in the first embodiment, the absolute values of threshold voltages of the dummy p-type MOS transistors 10a and 10b are set higher than the absolute values of threshold voltages of the first and second p-type MOS transistors 4a and 4b. Thus the dummy p-type MOS transistors 10a and 10b are turned off with higher reliability than the first and second p-type MOS transistors 4a and 4b. In other words, it is possible to suppress leakage current between the standard cell 501 and the standard cells 1b that are adjacent to the standard cell 501 through the second borderlines 100b.

Further, as in the first embodiment, the gate lengths of the dummy p-type MOS transistors 10a and 10b may be set longer than the gate lengths of the first and second p-type MOS transistors 4a and 4b in order to suppress the leakage current.

Moreover, the standard cell 501 includes dummy n-type MOS transistors 12a and 12b for device isolation between the standard cell 501 and the standard cells 1b that are adjacent to the standard cell 501 through the second borderlines 100b. The dummy n-type MOS transistors 12a and 12b include fourth gate electrodes 11a and 11b which are disposed on the second borderlines 100b so as to be adjacent to the second diffused regions 505a and 505c of the first and second n-type MOS transistors 8a and 8b.

In this configuration, the ground wiring 102 is formed on, for example, a wiring layer disposed above a wiring layer in which the fourth gate electrodes 11a and 11b are formed.

As in the first embodiment, the fourth gate electrodes 11a and 11b of the dummy n-type MOS transistors 12a and 12b are connected to the ground wiring 102 via second contacts 514a and 514b that are connected to the ends of the fourth gate electrodes 11a and 11b at the center of the standard cell 501. Therefore, a ground potential GND is applied to the fourth gate electrodes 11a and 11b so as to turn off the dummy n-type MOS transistors 12a and 12b.

As in the first embodiment, the absolute values of threshold voltages of the dummy n-type MOS transistors 12a and 12b are set higher than the absolute values of threshold voltages of the first and second n-type MOS transistors 8a and 8b. Thus the dummy n-type MOS transistors 12a and 12b are turned off with higher reliability than the first and second n-type MOS transistors 8a and 8b. In other words, it is possible to suppress leakage current between the standard cell 501 and the standard cells 1b that are adjacent to the standard cell 501 through the second borderlines 100b.

Further, the gate lengths of the dummy n-type MOS transistors 12a and 12b may be set longer than the gate lengths of the first and second n-type MOS transistors 8a and 8b in order to suppress the leakage current.

As described above, the gates of the dummy p-type MOS transistors 10a and 10b are connected to the power supply potential VDD and the gates of the dummy n-type MOS transistors 12a and 12b are connected to the ground potential GND, so that the transistors are turned off and insulation is provided between the standard cells that are adjacent to each other through the second borderlines 100b.

As described above, in the semiconductor integrated circuit 500 configured thus, the standard cell 501 and the standard cells 1b are isolated from each other by the dummy p-type MOS transistors 10a and 10b and the dummy n-type MOS transistors 12a and 12b which are provided on the second borderlines 100b. Thus it is possible to reduce the influence of a stress on the MOS transistors at least in the directions of the first borderlines 100a (in the channel directions of the MOS transistors).

Therefore, it is possible to avoid STI stress and increase the predictability of the on currents of the MOS transistors composing the standard cell.

Moreover, since the dummy transistors are provided on the borderlines of the standard cell, the diffused regions can be formed continuously from the other standard cells adjacent to the diffused regions.

As described above, the standard cell 501 and the standard cells 1a are isolated from each other by STI provided along the first borderlines 100a.

As in the first embodiment, for example, distances "X" (the widths of the diffused regions) are set at 2 μm or less between the first gate electrode 3a of the first p-type MOS transistor 4a and the third gate electrode 9a of the dummy p-type MOS transistor 10a and between the first gate electrode 3b of the second p-type MOS transistor 4b and the third gate electrode 9b of the dummy p-type MOS transistor 10b. Similarly, for example, distances "X" are set at 2 μm or less between the second gate electrode 6a of the first n-type MOS transistor 8a and the fourth gate electrode 11a of the dummy n-type MOS transistor 12a and between the second gate electrode 6b of the second n-type MOS transistor 8b and the fourth gate electrode of the dummy n-type MOS transistor 12b.

Thus device isolation can be achieved by the dummy MOS transistors particularly in a range where device isolation by STI may cause a stress affecting the channel (the diffused region has a width of 2 μm or less), so that the stress can be avoided.

When the dummy MOS transistors have disadvantageous gate leakage current, the gate leakage can be avoided at least by forming the gates using a high dielectric material.

As described above, according to the semiconductor integrated circuit of the present embodiment, it is possible to achieve device isolation between the adjacent standard cells while avoiding the influence of the device isolation on the MOS transistors.

Seventh Embodiment

The sixth embodiment described an example of a standard cell including a two-input NAND circuit made up of MOS transistors.

The present embodiment will describe another example of a standard cell including a two-input NAND circuit made up of MOS transistors.

Figure 9:
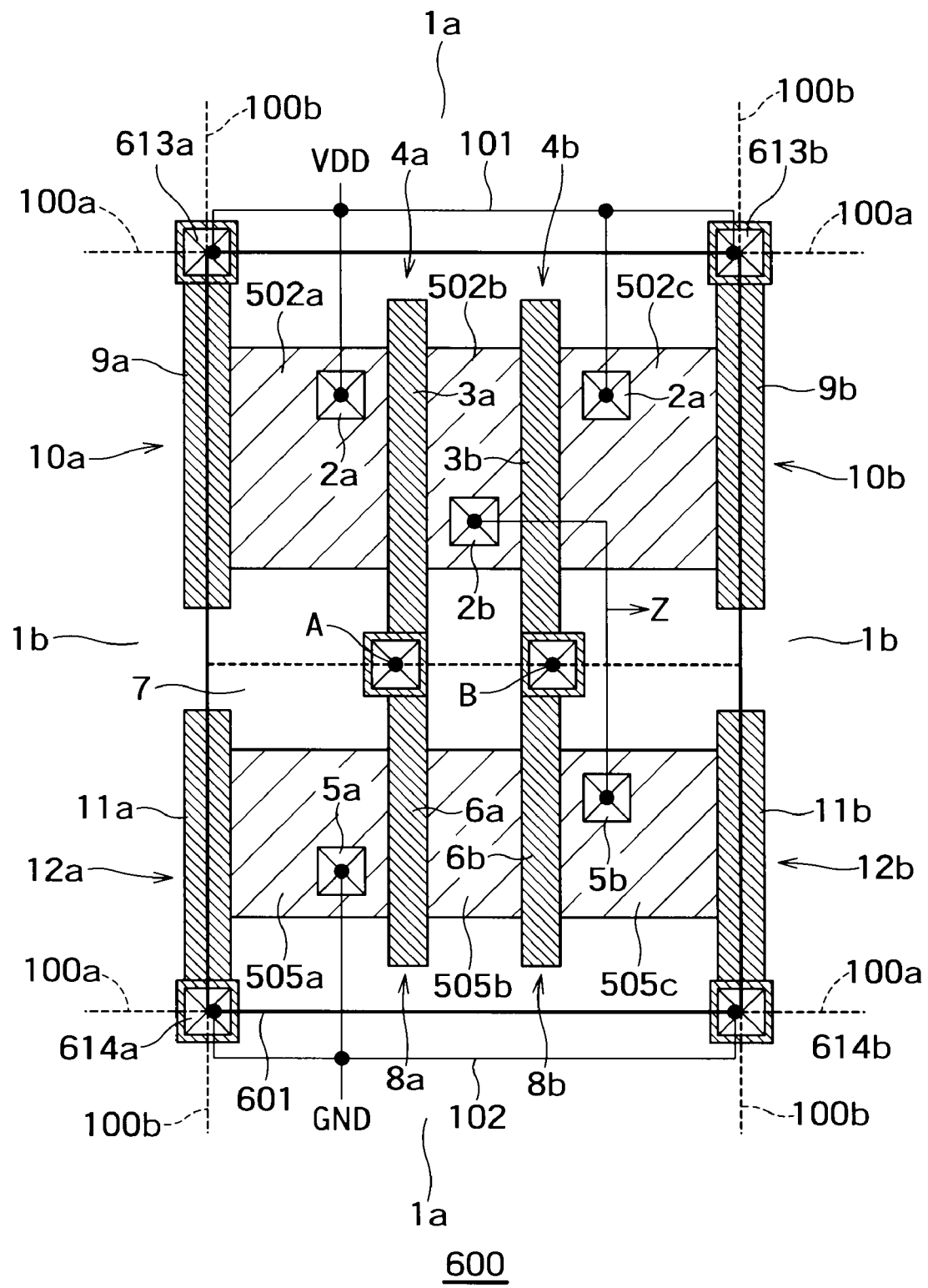
FIG. 9 shows the main configuration of a semiconductor integrated circuit 600 according to a seventh embodiment of the present invention.

FIG. 9 shows the main configuration of a semiconductor integrated circuit 600 according to a seventh embodiment of the present invention.

In FIG. 9, the same reference numerals as those of FIG. 7 indicate the same configurations as those of the sixth embodiment. Further, in FIG. 9, the circuit configuration of the standard cell of the semiconductor integrated circuit 600 is identical to the circuit configuration of the circuit diagram shown in FIG. 8.

As shown in FIG. 9, the semiconductor integrated circuit 600 has a substantially rectangular standard cell 601 which is divided by first borderlines 100a opposed to other standard cells 1a longitudinally adjacent to the standard cell 601, and second borderlines 100b opposed to other standard cells 1b laterally adjacent to the standard cell 601. For example, the other standard cells 1a longitudinally adjacent to the standard cell 601 and the other standard cells 1b laterally adjacent to the standard cell 601 are identical in configuration to the standard cell 601.

The standard cell 601 is identical in configuration to the standard cell 501 of the sixth embodiment except for the layout of first and second contacts.

To be specific, first contacts 613a and 613b are formed on the intersection points of the second borderlines 100b and the first borderline 100a disposed close to first and second p-type MOS transistors 4a and 4b. Similarly, second contacts 614a and 614b are formed on the intersection points of the second borderlines 100b and the first borderline 100a disposed close to first and second n-type MOS transistors 8a and 8b.

Further, third gate electrodes 9a and 9b of dummy p-type MOS transistors 10a and 10b are connected to power supply wiring 101 via the first contacts 613a and 613b connected to the third gate electrodes 9a and 9b. Therefore, a power supply potential VDD is applied to the third gate electrodes 9a and 9b so as to turn off the dummy p-type MOS transistors 10a and 10b.

Similarly, fourth gate electrodes 11a and 11b of dummy n-type MOS transistors 12a and 12b are connected to ground wiring 102 via the second contacts 614a and 614b connected to the fourth gate electrodes 11a and 11b. Therefore, a ground potential GND is applied to the fourth gate electrodes 11a and 11b so as to turn off the dummy n-type MOS transistors 12a and 12b.

Thus the gate voltages of the dummy MOS transistors can be directly supplied from, for example, the power supply wiring 101 and the ground wiring 102 which are provided near the first borderlines 100a.

As described above, as in the sixth embodiment, the gates of the dummy p-type MOS transistors 10a and 10b are connected to the power supply potential VDD and the gates of the dummy n-type MOS transistors 12a and 12b are connected to the ground potential GND, so that the transistors are turned off and insulation is provided between the standard cells that are adjacent to each other through the second borderlines 100b.

As described above, in the semiconductor integrated circuit 600 configured thus, the standard cell 601 and the standard cells 1b are isolated from each other by the dummy p-type MOS transistors 10a and 10b and the dummy n-type MOS transistors 12a and 12b which are provided on the second borderlines 100b. Thus it is possible to reduce the influence of a stress on the MOS transistors at least in the directions of the first borderlines 100a (in the channel directions of the MOS transistors).

Therefore, it is possible to avoid STI stress and increase the predictability of the on currents of the MOS transistors composing the standard cell.

Moreover, since the dummy MOS transistors are provided on the borderlines of the standard cell, diffused regions can be formed continuously from the other standard cells adjacent to the diffused regions.

The standard cell 601 and the standard cells 1a are isolated from each other by STI provided along the first borderlines 100a.

As described above, according to the semiconductor integrated circuit of the present embodiment, it is possible to achieve device isolation between the adjacent standard cells while avoiding the influence of the device isolation on the MOS transistors as in the sixth embodiment.

Eighth Embodiment

The sixth and seventh embodiments described examples of a standard cell including a two-input NAND circuit made up of MOS transistors.

The present embodiment will describe an example of a standard cell including a two-input NOR circuit made up of MOS transistors.

Figure 10:
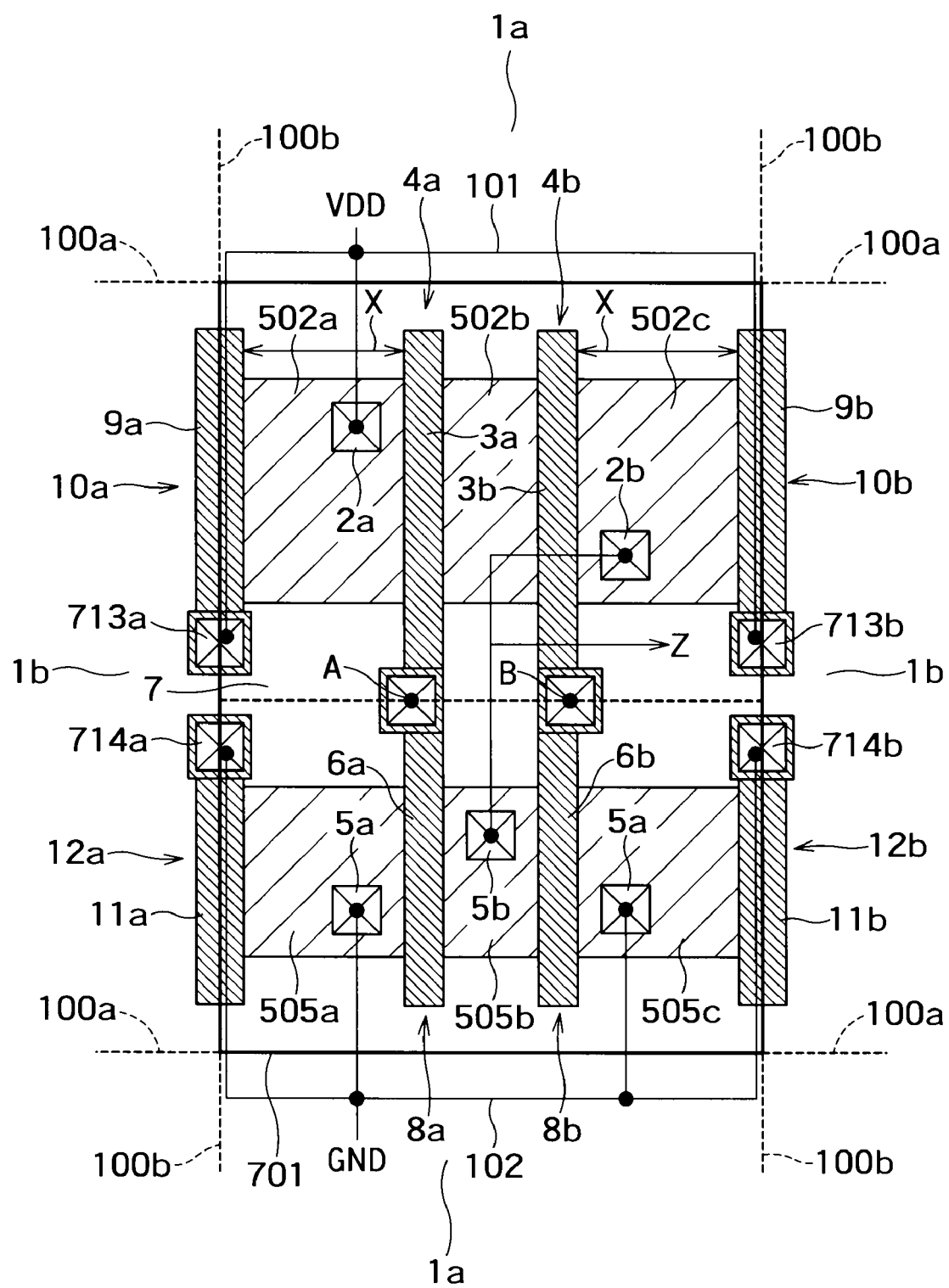
FIG. 10 shows the main configuration of a semiconductor integrated circuit 700 according to an eighth embodiment which is an aspect of the present invention.
Figure 11:
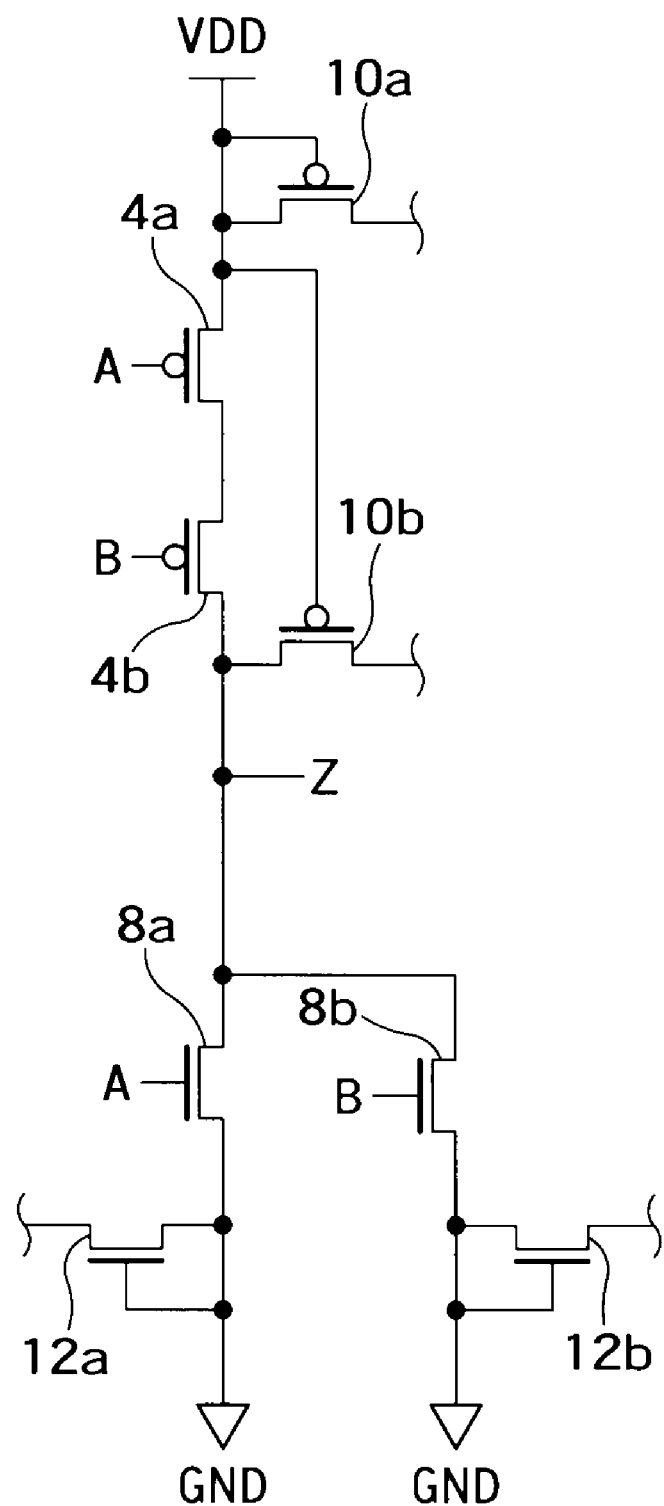
FIG. 11 is a circuit diagram showing the circuit configuration of the standard cell of the semiconductor integrated circuit 700 shown in FIG. 10.

FIG. 10 shows the main configuration of a semiconductor integrated circuit 700 according to an eighth embodiment which is an aspect of the present invention. FIG. 11 is a circuit diagram showing the circuit configuration of the standard cell of the semiconductor integrated circuit 700 shown in FIG. 10.

As shown in FIG. 10, the semiconductor integrated circuit 700 has a substantially rectangular standard cell 701 which is divided by first borderlines 100a opposed to other standard cells 1a longitudinally adjacent to the standard cell 701, and second borderlines 100b opposed to other standard cells 1b laterally adjacent to the standard cell 701. For example, the other standard cells 1a longitudinally adjacent to the standard cell 701 and the other standard cells 1b laterally adjacent to the standard cell 701 are identical in configuration to the standard cell 701.

As in the sixth embodiment, the standard cell 701 includes a first p-type MOS transistor 4a which has first diffused regions 502a and 502b and a first gate electrode 3a and a second p-type MOS transistor 4b which has the first diffused region 502b, a first diffused region 502c, and a first gate electrode 3b.

Further, the standard cell 701 includes a first n-type MOS transistor 8a which has second diffused regions 505a and 505b and a second gate electrode 6a and a second n-type MOS transistor 8b which has the second diffused region 505b, a second diffused region 505c, and a second gate electrode 6b.

The first and second n-type MOS transistors 8a and 8b have STI 7 disposed for device isolation between the first and second n-type MOS transistors 8a and 8b and the first and second p-type MOS transistors 4a and 4b substantially in parallel with the first borderlines 100a.

As shown in FIGS. 10 and 11, the first p-type MOS transistor 4a has the source connected to power supply wiring 101 via a contact 2a, the drain connected to the source of the second p-type MOS transistor 4b, and the gate connected to an input A and the gate of the first n-type MOS transistor 8a.

Further, the second p-type MOS transistor 4b has the drain connected to an output Z and the drains of the first and second n-type MOS transistors 8a and 8b via a contact 2b, and the gate connected to an input B and the gate of the second n-type MOS transistor 8b.

The first and second n-type MOS transistors 8a and 8b have the sources connected to ground wiring 102 via contacts 5a, the drains connected to the output Z via a contact 5b, and the gates connected to the inputs A and B.

In this way, in FIGS. 10 and 11, the standard cell 701 includes an NOR layout of two inputs (A, B) made up of the first and second p-type MOS transistors 4a and 4b and the first and second n-type MOS transistors 8a and 8b.

Further, as in the sixth embodiment, the standard cell 701 includes dummy p-type MOS transistors 10a and 10b for device isolation between the standard cell 701 and the standard cells 1b that are adjacent to the standard cell 701 through the second borderlines 100b. The dummy p-type MOS transistors 10a and 10b include third gate electrodes 9a and 9b which are disposed on the second borderlines 100b so as to be adjacent to first diffused regions 502a and 502c of the first and second p-type MOS transistors 4a and 4b respectively.

In this configuration, the power supply wiring 101 is formed on, for example, a wiring layer disposed above a wiring layer in which the third gate electrodes 9a and 9b are formed.

As in the sixth embodiment, the third gate electrodes 9a and 9b of the dummy p-type MOS transistors 10a and 10b are connected to the power supply wiring 101 via first contacts 713a and 713b that are connected to the ends of the third gate electrodes 9a and 9b at the center of the standard cell 701. Therefore, a power supply potential VDD is applied to the third gate electrodes 9a and 9b so as to turn off the dummy p-type MOS transistors 10a and 10b.

As in the sixth embodiment, the absolute values of threshold voltages of the dummy p-type MOS transistors 10a and 10b are set higher than the absolute values of threshold voltages of the first and second p-type MOS transistors 4a and 4b. Thus the dummy p-type MOS transistors 10a and 10b are turned off with higher reliability than the first and second p-type MOS transistors 4a and 4b. In other words, it is possible to suppress leakage current between the standard cell 701 and the standard cells 1b that are adjacent to the standard cell 701 through the second borderlines 100b.

As in the sixth embodiment, the gate lengths of the dummy p-type MOS transistors 10a and 10b may be set longer than the gate lengths of the first and second p-type MOS transistors 4a and 4b in order to suppress the leakage current.

Further, the standard cell 701 includes dummy n-type MOS transistors 12a and 12b for device isolation between the standard cell 701 and the standard cells 1b that are adjacent to the standard cell 701 through the second borderlines 100b. The dummy n-type MOS transistors 12a and 12b include fourth gate electrodes 11a and 11b that are disposed on the second borderlines 100b so as to be adjacent to the second diffused regions 505a and 505c of the first and second n-type MOS transistors 8a and 8b.

In this configuration, the ground wiring 102 is formed on, for example, a wiring layer disposed above a wiring layer in which the fourth gate electrodes 11a and 11b are formed.

As in the sixth embodiment, the fourth gate electrodes 11a and 11b of the dummy n-type MOS transistors 12a and 12b are connected to the ground wiring 102 via second contacts 714a and 714b that are connected to the ends of the fourth gate electrodes 11a and 11b at the center of the standard cell 701. Therefore, a ground potential GND is applied to the fourth gate electrodes 11a and 11b so as to turn off the dummy n-type MOS transistors 12a and 12b.

As in the sixth embodiment, the absolute values of threshold voltages of the dummy n-type MOS transistors 12a and 12b are set higher than the absolute values of threshold voltages of the first and second n-type MOS transistors 8a and 8b. Thus the dummy n-type MOS transistors 12a and 12b are turned off with higher reliability than the first and second n-type MOS transistors 8a and 8b. In other words, it is possible to suppress leakage current between the standard cell 701 and the standard cells 1b that are adjacent to the standard cell 701 through the second borderlines 100b.

Further, the gate lengths of the dummy n-type MOS transistors 12a and 12b may be set longer than the gate lengths of the first and second n-type MOS transistors 8a and 8b in order to suppress the leakage current.

As described above, the gates of the dummy p-type MOS transistors 10a and 10b are connected to the power supply potential VDD and the gates of the dummy n-type MOS transistors 12a and 12b are connected to the ground potential GND, so that the transistors are turned off and insulation is provided between the standard cells that are adjacent to each other through the second borderlines 100b.

As described above, in the semiconductor integrated circuit 700 configured thus, the standard cell 701 and the standard cells 1b are isolated from each other by the dummy p-type MOS transistors 10a and 10b and the dummy n-type MOS transistors 12a and 12b which are provided on the second borderlines 100b. Thus it is possible to reduce the influence of a stress on the MOS transistors at least in the directions of the first borderlines 100a (in the channel directions of the MOS transistors).

Therefore, it is possible to avoid STI stress and increase the predictability of the on currents of the MOS transistors composing the standard cell.

Moreover, since the dummy MOS transistors are provided on the borderlines of the standard cell, the diffused regions can be formed continuously from the other standard cells adjacent to the diffused regions.

The standard cell 701 and the standard cells 1a are isolated from each other, as described above, by STI provided along the first borderlines 100a.

As in the sixth embodiment, for example, distances "X" (the widths of the diffused regions) are set at 2 μm or less between the first gate electrode 3a of the first p-type MOS transistor 4a and the third gate electrode 9a of the dummy p-type MOS transistor 10a and between the first gate electrode 3b of the second p-type MOS transistor 4b and the third gate electrode 9b of the dummy p-type MOS transistor 10b. Similarly, for example, distances "X" are set at 2 μm or less between the second gate electrode 6a of the first n-type MOS transistor 8a and the fourth gate electrode 11a of the dummy n-type MOS transistor 12a and between the second gate electrode 6b of the second n-type MOS transistor 8b and the fourth gate of the dummy n-type MOS transistor 12b.

Thus device isolation can be achieved by the dummy MOS transistors particularly in a range where device isolation by STI may cause a stress affecting the channel (the diffused region has a width of 2 μm or less), so that the stress can be avoided.

When the dummy MOS transistors have disadvantageous gate leakage current, the gate leakage can be avoided at least by forming the gates using a high dielectric material.

As described above, according to the semiconductor integrated circuit of the present embodiment, it is possible to achieve device isolation between the adjacent standard cells while avoiding the influence of the device isolation on the MOS transistors.

Ninth Embodiment

The eighth embodiment described an example of a standard cell including a two-input NOR circuit made up of MOS transistors.

The present embodiment will describe another example of a standard cell including a two-input NOR circuit made up of MOS transistors.

Figure 12:
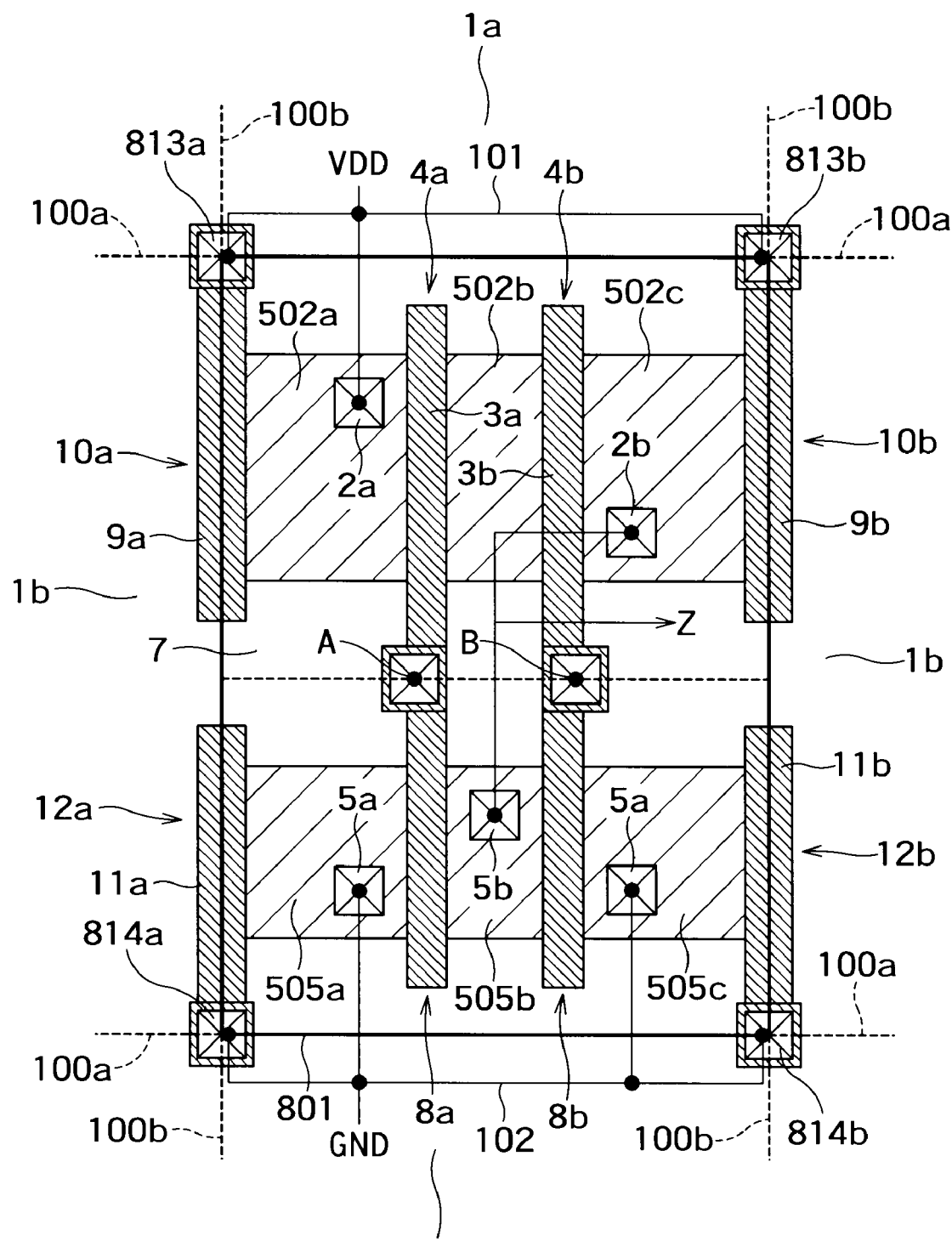
FIG. 12 shows the main configuration of a semiconductor integrated circuit 800 according to a ninth embodiment of the present invention.

FIG. 12 shows the main configuration of a semiconductor integrated circuit 800 according to a ninth embodiment of the present invention.

In FIG. 12, the same reference numerals as those of FIG. 10 indicate the same configurations as those of the eighth embodiment. Further, in FIG. 12, the circuit configuration of the standard cell of the semiconductor integrated circuit 800 is identical to the circuit configuration of the circuit diagram shown in FIG. 11.

As shown in FIG. 12, the semiconductor integrated circuit 800 has a substantially rectangular standard cell 801 which is divided by first borderlines 100a opposed to other standard cells 1a longitudinally adjacent to the standard cell 801, and second borderlines 100b opposed to other standard cells 1b laterally adjacent to the standard cell 801. For example, the other standard cells 1a longitudinally adjacent to the standard cell 801 and the other standard cells 1b laterally adjacent to the standard cell 801 are identical in configuration to the standard cell 801.

The standard cell 801 is identical in configuration to the standard cell 701 of the eighth embodiment except for the layout of first and second contacts.

To be specific, first contacts 813a and 813b are formed on the intersection points of the second borderlines 100b and the first borderline 100a disposed close to first and second p-type MOS transistors 4a and 4b. Similarly, second contacts 814a and 814b are formed on the intersection points of the second borderlines 100b and the first borderline 100a disposed close to first and second n-type MOS transistors 8a and 8b.

Further, third gate electrodes 9a and 9b of dummy p-type MOS transistors 10a and 10b are connected to power supply wiring 101 via the first contacts 813a and 813b that are connected to the third gate electrodes 9a and 9b. Therefore, a power supply potential VDD is applied to the third gate electrodes 9a and 9b so as to turn off the dummy p-type MOS transistors 10a and 10b.

Similarly, fourth gate electrodes 11a and 11b of dummy n-type MOS transistors 12a and 12b are connected to ground wiring 102 via the second contacts 814a and 814b that are connected to the fourth gate electrodes 11a and 11b. Therefore, a ground potential GND is applied to the fourth gate electrodes 11a and 11b so as to turn off the dummy n-type MOS transistors 12a and 12b.

Thus the gate voltages of the dummy MOS transistors can be directly supplied from, for example, the power supply wiring 101 and the ground wiring 102 which are provided near the first borderlines 100a.

As described above, as in the sixth embodiment, the gates of the dummy p-type MOS transistors 10a and 10b are connected to the power supply potential VDD and the gates of the dummy n-type MOS transistors 12a and 12b are connected to the ground potential GND, so that the transistors are turned off and insulation is provided between the standard cells that are adjacent to each other through the second borderlines 100b.

As described above, in the semiconductor integrated circuit 800 configured thus, the standard cell 801 and the standard cells 1b are isolated from each other by the dummy p-type MOS transistors 10a and 10b and the dummy n-type MOS transistors 12a and 12b which are provided on the second borderlines 100b. Thus it is possible to reduce the influence of a stress on the MOS transistors at least in the directions of the first borderlines 100a (in the channel directions of the MOS transistors).

Therefore, it is possible to avoid STI stress and increase the predictability of the on currents of the MOS transistors composing the standard cell.

Moreover, since the dummy MOS transistors are provided on the borderlines of the standard cell, diffused regions can be formed continuously from the other standard cells adjacent to the diffused regions.

The standard cell 801 and the standard cells 1a are isolated from each other by STI provided along the first borderlines 100a.

As described above, according to the semiconductor integrated circuit of the present embodiment, it is possible to achieve device isolation between the adjacent standard cells while avoiding the influence of the device isolation on the MOS transistors as in the eighth embodiment.

The aforementioned embodiments described, for example, inverters, two-input NAND circuits, and two-inputs NOR circuits. The present invention is similarly applicable to standard cells including typical CMOS logic circuits, in addition to the aforementioned circuit configurations.

In order to suppress leakage current in the aforementioned embodiments, for example, the absolute values of threshold voltages of the dummy MOS transistors for device isolation are set higher than the absolute values of threshold voltages of the typical MOS transistors disposed in the standard cell. The absolute values of threshold voltages of the dummy MOS transistors may be equal to the absolute values of threshold voltages of the typical MOS transistors when necessary.

What is claimed is:

1. A semiconductor integrated circuit having a substantially rectangular standard cell divided by first borderlines opposed to other standard cells longitudinally adjacent to the standard cell and second borderlines opposed to other standard cells laterally adjacent to the standard cell, the standard cell comprising:
a p-type MOS transistor having first diffused regions and a first gate electrode;
an n-type MOS transistor having second diffused regions and a second gate electrode with STI disposed for device isolation between the n-type MOS transistor and the p-type MOS transistor substantially in parallel with the first borderlines;
dummy p-type MOS transistors having third gate electrodes disposed on the second borderlines so as to be adjacent to the first diffused regions of the p-type MOS transistor, the third gate electrodes being connected to power supply wiring so as to turn off the dummy p-type MOS transistors; and
dummy n-type MOS transistors having fourth gate electrodes disposed on the second borderlines so as to be adjacent to the second diffused regions of the n-type MOS transistor, the fourth gate electrodes being connected to ground wiring so as to turn off the dummy n-type MOS transistors,
wherein an absolute value of threshold voltage of the dummy p-type MOS transistor is higher than an absolute value of threshold voltage of the p-type MOS transistor, and
an absolute value of threshold voltage of the dummy n-type MOS transistor is higher than an absolute value of threshold voltage of the n-type MOS transistor.

2. The semiconductor integrated circuit according to claim 1, wherein the power supply wiring is formed on a layer disposed above a layer in which the third gate electrodes are formed,
the ground wiring is formed on a layer disposed above a layer in which the fourth gate electrodes are formed,
the third gate electrodes of the dummy p-type MOS transistors are connected to the power supply wiring via first contacts, and
the fourth gate electrodes of the dummy n-type MOS transistors are connected to the ground wiring via second contacts.

3. The semiconductor integrated circuit according to claim 2, wherein the first contacts are formed on intersection points of the second borderlines and the first borderline disposed close to the p-type MOS transistor, and
the second contacts are formed on intersection points of the second borderlines and the first borderline disposed close to the n-type MOS transistor.

4. The semiconductor integrated circuit according to claim 1, wherein distances between the first gate electrode of the p-type MOS transistor and the third gate electrodes of the dummy p-type MOS transistors are 2 μm or less, and
distances between the second gate electrode of the n-type MOS transistor and the fourth gate electrodes of the dummy n-type MOS transistors are 2 μm or less.

5. The semiconductor integrated circuit according to claim 2, wherein distances between the first gate electrode of the p-type MOS transistor and the third gate electrodes of the dummy p-type MOS transistors are 2 μm or less, and
distances between the second gate electrode of the n-type MOS transistor and the fourth gate electrodes of the dummy n-type MOS transistors are 2 μm or less.

6. The semiconductor integrated circuit according to claim 3, wherein distances between the first gate electrode of the p-type MOS transistor and the third gate electrodes of the dummy p-type MOS transistors are 2 μm or less, and
distances between the second gate electrode of the n-type MOS transistor and the fourth gate electrodes of the dummy n-type MOS transistors are 2 μm or less.

7. A semiconductor integrated circuit having a substantially rectangular standard cell divided by first borderlines opposed to other standard cells longitudinally adjacent to the standard cell and second borderlines opposed to other standard cells laterally adjacent to the standard cell, the standard cell comprising:
a p-type MOS transistor having first diffused regions and a first gate electrode;
an n-type MOS transistor having second diffused regions and a second gate electrode with STI disposed for device isolation between the n-type MOS transistor and the p-type MOS transistor substantially in parallel with the first borderlines;
dummy p-type MOS transistors having third gate electrodes disposed on the second borderlines so as to be adjacent to the first diffused regions of the p-type MOS transistor, the third gate electrodes being connected to power supply wiring so as to turn off the dummy p-type MOS transistors; and
dummy n-type MOS transistors having fourth gate electrodes disposed on the second borderlines so as to be adjacent to the second diffused regions of the n-type MOS transistor, the fourth gate electrodes being connected to ground wiring so as to turn off the dummy n-type MOS transistors,
wherein the dummy p-type MOS transistor has a gate length greater than a gate length of the p-type MOS transistor, and
the dummy n-type MOS transistor has a gate length greater than a gate length of the n-type MOS transistor.

8. The semiconductor integrated circuit according to claim 7, wherein the power supply wiring is formed on a layer disposed above a layer in which the third gate electrodes are formed,
the ground wiring is formed on a layer disposed above a layer in which the fourth gate electrodes are formed,
the third gate electrodes of the dummy p-type MOS transistors are connected to the power supply wiring via first contacts, and
the fourth gate electrodes of the dummy n-type MOS transistors are connected to the ground wiring via second contacts.

9. The semiconductor integrated circuit according to claim 8, wherein the first contacts are formed on intersection points of the second borderlines and the first borderline disposed close to the p-type MOS transistor, and the second contacts are formed on intersection points of the second borderlines and the first borderline disposed close to the n-type MOS transistor.

10. The semiconductor integrated circuit according to claim 7, wherein distances between the first gate electrode of the p-type MOS transistor and the third gate electrodes of the dummy p-type MOS transistors are 2 µm or less, and distances between the second gate electrode of the n-type MOS transistor and the fourth gate electrodes of the dummy n-type MOS transistors are 2 µm or less.

11. The semiconductor integrated circuit according to claim 8, wherein distances between the first gate electrode of the p-type MOS transistor and the third gate electrodes of the dummy p-type MOS transistors are 2 µm or less, and distances between the second gate electrode of the n-type MOS transistor and the fourth gate electrodes of the dummy n-type MOS transistors are 2 µm or less.

12. The semiconductor integrated circuit according to claim 9, wherein distances between the first gate electrode of the p-type MOS transistor and the third gate electrodes of the dummy p-type MOS transistors are 2 µm or less, and distances between the second gate electrode of the n-type MOS transistor and the fourth gate electrodes of the dummy n-type MOS transistors are 2 µm or less.

13. A semiconductor integrated circuit having a substantially rectangular standard cell divided by first borderlines opposed to other standard cells longitudinally adjacent to the standard cell and second borderlines opposed to other standard cells laterally adjacent to the standard cell, the standard cell comprising:

a p-type MOS transistor having first diffused regions and a first gate electrode;

an n-type MOS transistor having second diffused regions and a second gate electrode with STI disposed for device isolation between the n-type MOS transistor and the p-type MOS transistor substantially in parallel with the first borderlines;

dummy p-type MOS transistors having third gate electrodes disposed on the second borderlines so as to be adjacent to the first diffused regions of the p-type MOS transistor, the third gate electrodes being connected to power supply wiring so as to turn off the dummy p-type MOS transistors; and dummy n-type MOS transistors having fourth gate electrodes disposed on the second borderlines so as to be adjacent to the second diffused regions of the n-type MOS transistor, the fourth gate electrodes being connected to ground wiring so as to turn off the dummy n-type MOS transistors, wherein the third gate electrodes of the dummy p-type MOS transistors are connected to the power supply wiring formed on a wiring layer disposed above a layer in which the third gate electrodes are formed, and the fourth gate electrodes of the dummy n-type MOS transistors are connected to the ground wiring formed on a wiring layer disposed above a layer in which the fourth gate electrodes are formed.

14. The semiconductor integrated circuit according to claim 13, wherein distances between the first gate electrode of the p-type MOS transistor and the third gate electrodes of the dummy p-type MOS transistors are 2 µm or less, and distances between the second gate electrode of the n-type MOS transistor and the fourth gate electrodes of the dummy n-type MOS transistors are 2 µm or less.

* * * * *